(12) United States Patent
Neu et al.

(10) Patent No.: US 6,400,006 B2
(45) Date of Patent: Jun. 4, 2002

(54) INTEGRATED COMPONENT, COMPOSITE ELEMENT COMPRISING AN INTEGRATED COMPONENT AND A CONDUCTOR STRUCTURE, CHIP CARD, AND METHOD OF PRODUCING THE INTEGRATED COMPONENT

(75) Inventors: Achim Neu, Regensburg; Thies Janczek, Flintbek, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/771,675

(22) Filed: Jan. 29, 2001

Related U.S. Application Data

(63) Continuation of application No. PCT/DE99/02190, filed on Jul. 14, 1999.

(30) Foreign Application Priority Data

Jul. 28, 1998 (DE) .......................................... 198 33 929

(51) Int. Cl.[7] ............................................... H01L 23/02
(52) U.S. Cl. ........................ 257/678; 257/666; 438/110
(58) Field of Search ................................ 257/666, 678; 438/110, 612

(56) References Cited

U.S. PATENT DOCUMENTS

| | | |
|---|---|---|
| 4,670,770 A | 6/1987 | Tai |
| 5,146,308 A | 9/1992 | Chance et al. |
| 5,356,838 A | 10/1994 | Kim |
| 5,604,328 A | 2/1997 | Kubota et al. |

FOREIGN PATENT DOCUMENTS

| | | |
|---|---|---|
| DE | 35 35 791 A1 | 5/1986 |
| DE | 43 37 921 A1 | 5/1995 |
| FR | 2 617 668 A1 | 1/1989 |
| FR | 2 673 042 A1 | 8/1992 |
| GB | 2 166 589 A | 5/1986 |
| JP | 1-181553 A | 7/1989 |
| JP | 1-189946 A | 7/1989 |

*Primary Examiner*—David Nelms
*Assistant Examiner*—Andy Huynh
(74) *Attorney, Agent, or Firm*—Laurence A. Greenberg; Werner H. Stemer; Ralph E. Locher

(57) ABSTRACT

The integrated component has a plurality of contact elements disposed at an edge region of a main surface of the integrated component which contains the functional element. The contact elements project into the edge region of the main surface and have at least one contact surface that is inclined relative to the main surface. The component is configured to be fastened to conductor tracks of a fastening device, such that the conductor tracks are disposed to face the component body and extend parallel to the main surface of the component body.

5 Claims, 7 Drawing Sheets

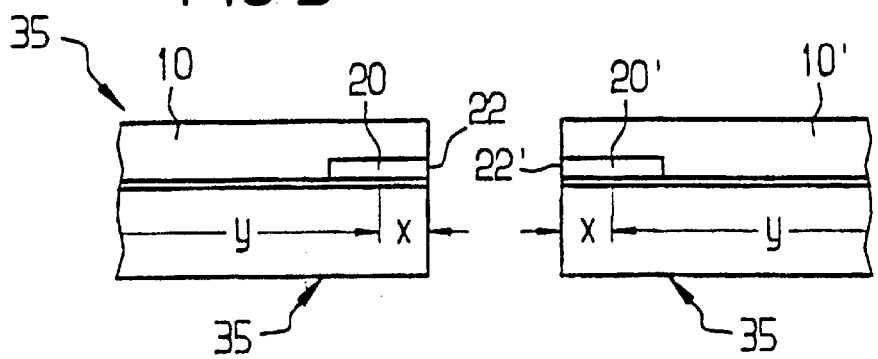
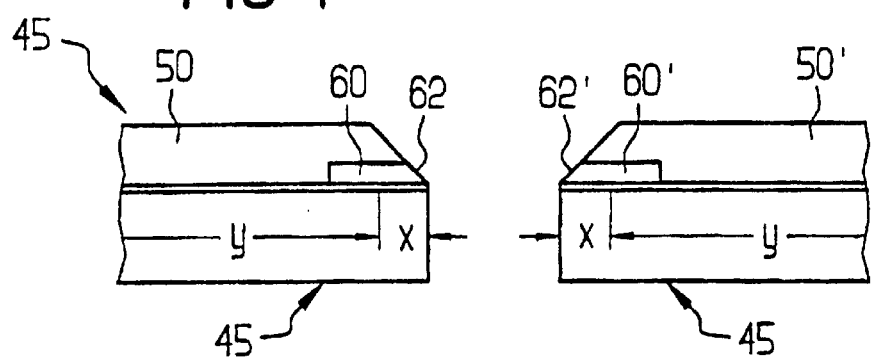
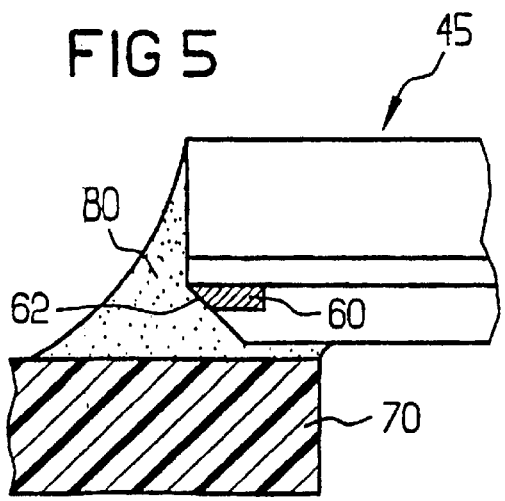

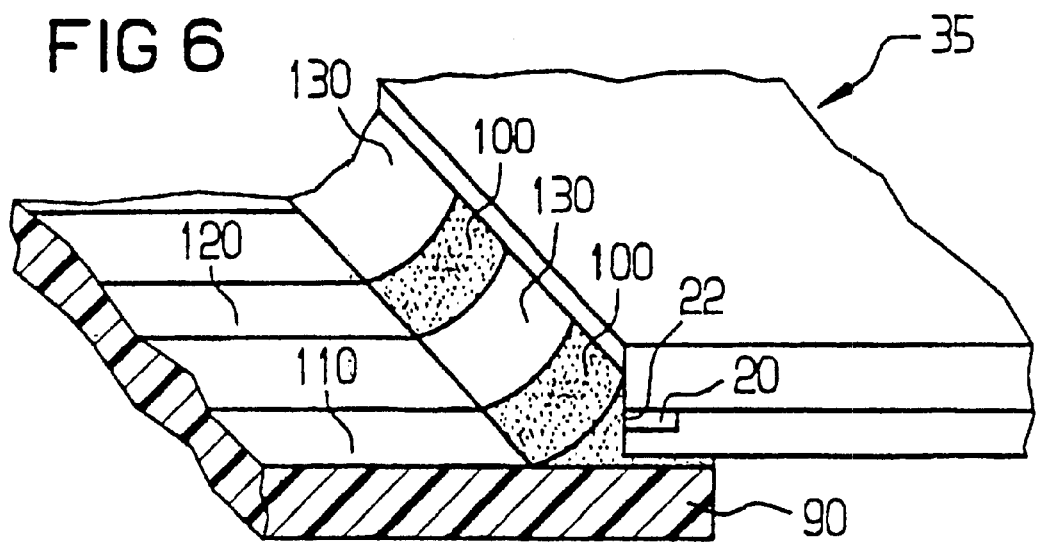
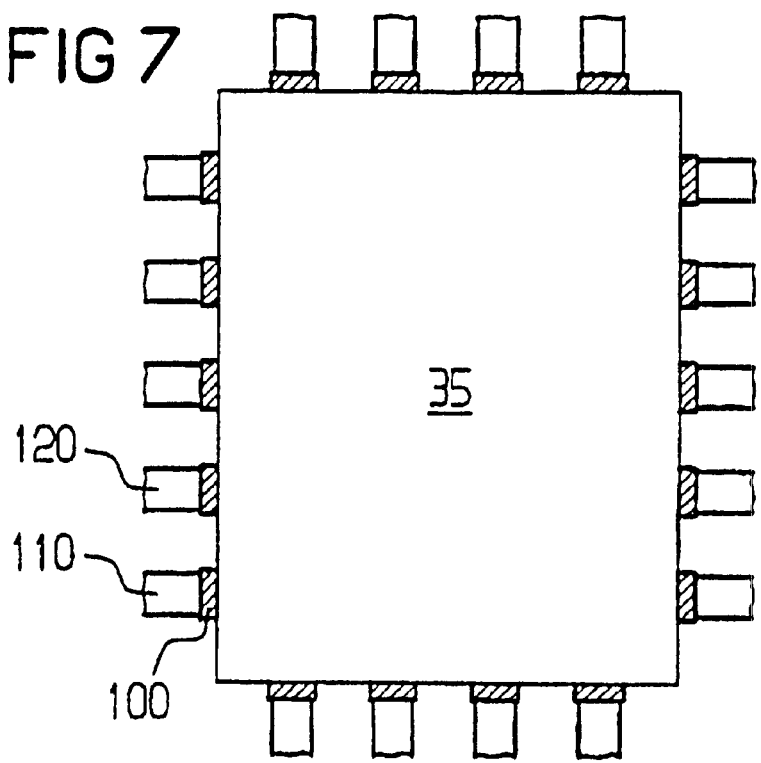

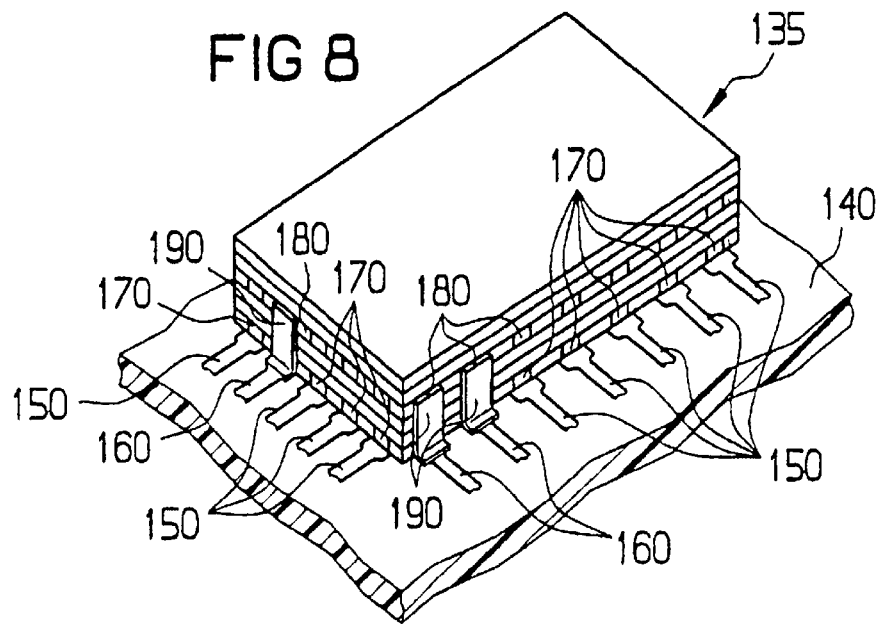
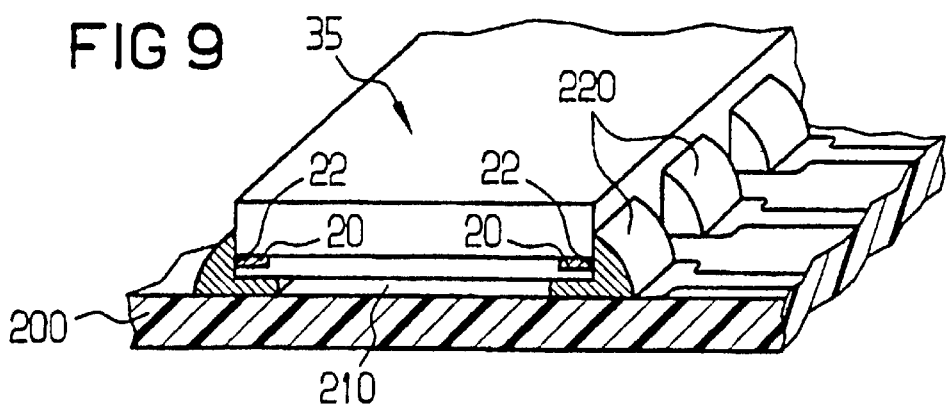
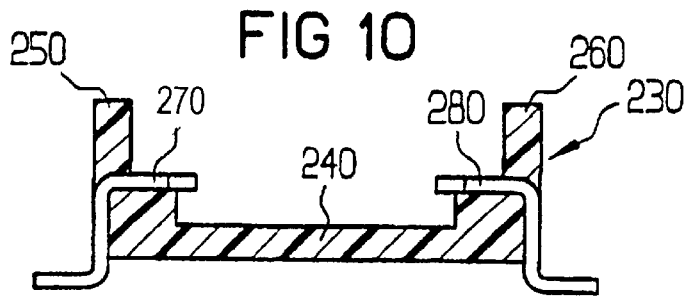

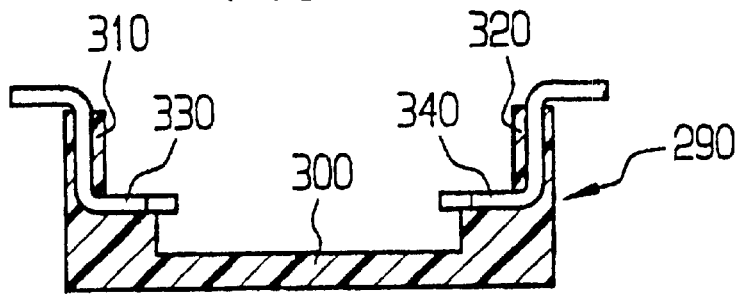
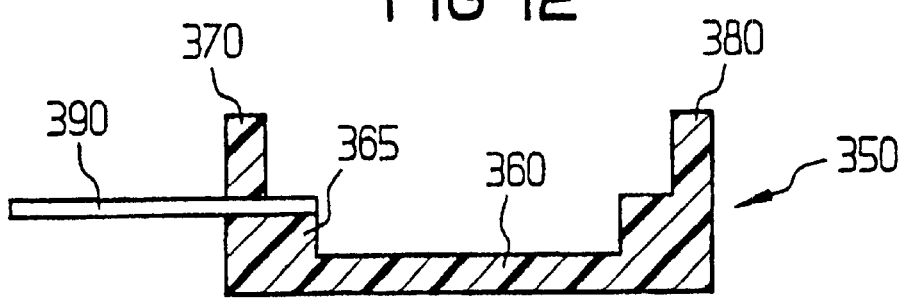
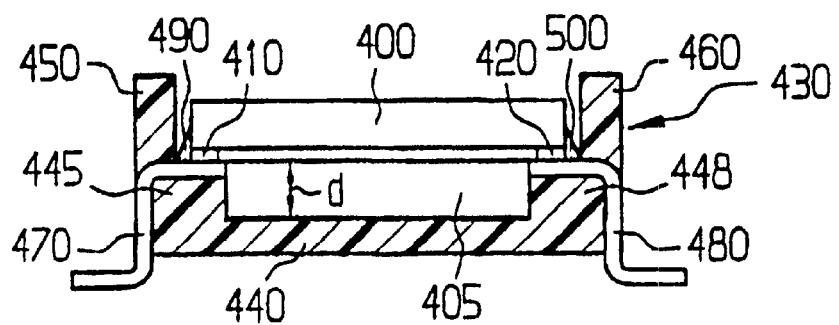

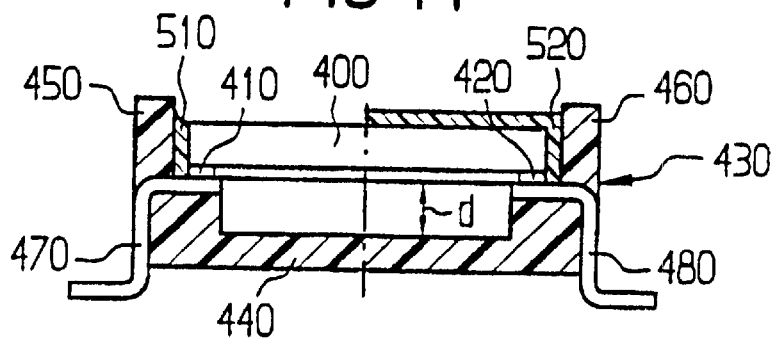
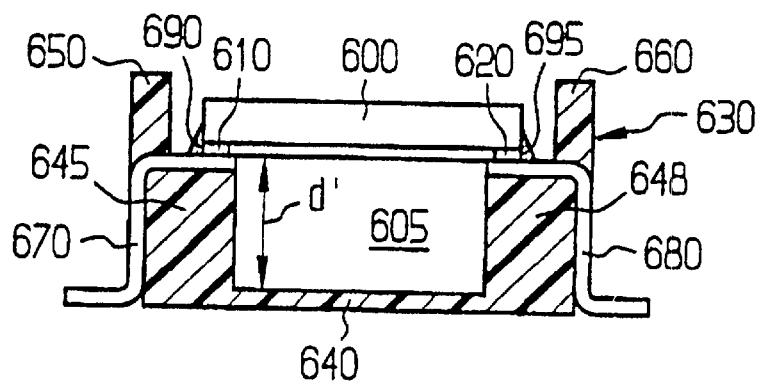
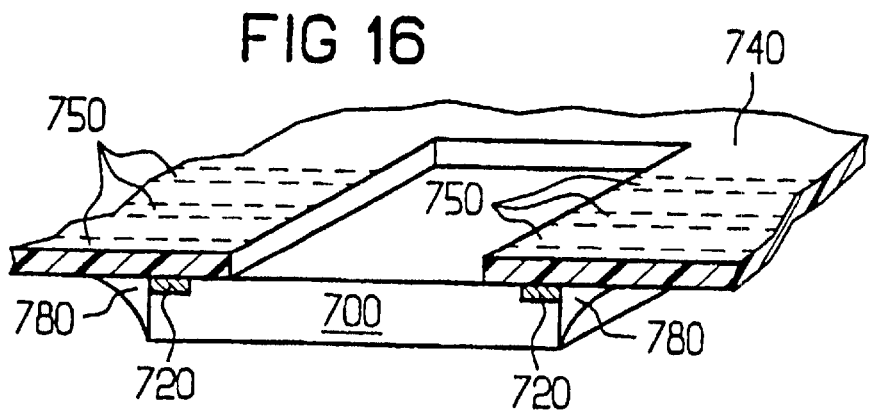

INTEGRATED COMPONENT, COMPOSITE ELEMENT COMPRISING AN INTEGRATED COMPONENT AND A CONDUCTOR STRUCTURE, CHIP CARD, AND METHOD OF PRODUCING THE INTEGRATED COMPONENT

CROSS-REFERENCE TO RELATED APPLICATION

This application is a continuation of copending International application No. PCT/DE99/02190, filed Jul. 14, 1999, which designated the United States.

BACKGROUND OF THE INVENTION

Field of the Invention

The invention lies in the field of integrated technology and pertains, more specifically, to an integrated component having at least one contact surface to connect the component to a fastening device.

In addition, the invention pertains to a composite element comprising an integrated component and a conductor structure, and also to a chip card.

The invention further relates to a method of producing an integrated component, in which at least one contact element for connecting the component to a fastening device is produced.

French published patent application FR 2 617 668 discloses an integrated component which has a number of contact elements arranged in an edge region of a main surface having functional elements.

In addition, it is known to connect a metal plane of an integrated circuit with connecting wires. A method which is often used provides for the application of a passivation layer after the structuring of the uppermost metal plane, the passivation layer being opened only at those points to which connecting wires (bonding wires) are fitted. Because of their shape, these points are also referred to as pads. The passivation layer most often consists of a double layer of plasma oxide an plasma nitride in typical thickness of 200 nm to 500 nm. In addition, a further passivation layer of polyimide in a thickness of 3 $\mu$m to 5 $\mu$m, a so-called soft passivation, is also known.

It is known that, as a result of mechanical stress differences in the layers, as a result of inadequate layer adhesion or as a result of stresses in a housing pressing compound, cracks can arise in the uppermost metallization layer and in the passivation layer.

SUMMARY OF THE INVENTION

The object of the present invention is to provide an integrated component and the related assemblies and systems which overcome the above-noted deficiencies and disadvantages of the prior art devices and methods of this general kind, and which integrated component is capable of being produced in the most simple and reliable manner and to ensure the longest possible service life of the contacts, even under thermal and/or mechanical loading.

With the above and other objects in view there is provided, in accordance with the invention, an integrated component, comprising:

a component body having a main surface with functional elements of the integrated component and with an edge region without functional elements;

a plurality of contact elements disposed at the edge region of the main surface, the contact elements projecting into the edge region of the main surface and having at least one contact surface inclined with respect to the main surface;

the component body being configured to be fastened to conductor tracks of a fastening device, wherein the conductor tracks are disposed to face the component body and extend parallel to the main surface of the component body.

In other words, the above objects are achieved, according to the invention, in a circuit of the generic type wherein the contact elements are arranged in an edge region of the integrated component in such a way that the contact elements have at least one contact surface which is inclined with respect to a main surface of the component.

The invention therefore provides for an integrated component which has contacts located in one or more of its edge regions. The term "integrated component" is intended to have a wide meaning here. It comprises, for example, individual functional elements, integrated circuits without or with a housing and modules which are ready to be installed. The individual functional elements may be sensors or actuators, in addition to active elements which normally occur in circuits. The term "contact element" is similarly to be understood as having a wide meaning. In particular, it is not restricted to the known contact surfaces (pads), but refers expressly also to such contacts which are used to connect any desired other structural plane of an integrated electronic circuit.

In accordance with an added feature of the invention, the contact elements are arranged in the edge region of the component body such that at least a portion thereof is in contact with the edge region of the main surface of the component body, and wherein, when the component body is stalled, the contact elements are brought into contact with least two surfaces of the fastening device arranged at an angle different from 0°.

It is particularly expedient to configure the component in such a way that the contact element is arranged in an edge region of the integrated component so that at least some portion thereof is located in contact with an edge region of a main surface of the component, and in that when the component is installed, the contact element can be brought into contact with at least two surfaces, arranged at an angle other than 0°, of a fastening device.

The term "fastening device" is intended to have its widest meaning. It includes, firstly, conventional leadframes and conductor structures and, secondly, also all further possible holders for the component.

The two surfaces of the housing with which the contact element can be brought into contact can be arranged at any desired angle to one another. An angle of 90° merely represents one example. An angle differing from 90° has the advantage that in the case of such oblique surfaces, a greater effective contact area can be achieved.

It is particularly expedient to equip the integrated component in such a way that there are no contact elements in an inner region of the area of the main surface.

In accordance with an additional feature of the invention, the inner area is printed and/or coated.

With the above and other objects in view there is also provided, in accordance with the invention, a composite element, which comprises a conductor structure and an integrated component as outlined above disposed on the conductor structure.

With the above and other objects in view there is also provided, in accordance with the invention, a chip card, comprising:

a basic body having a recess formed therein;

a component configured as an integrated electronic circuit disposed in the recess in the basic body and having a main surface;

the component having, disposed within the recess, at least one contact element for electrically connecting the component, the contact element having at least one contact surface inclined relative to the main surface of the component.

In accordance with various further feature of the invention, the component has a contact region and a rear side provided with a coating. The coating may be a laminated film and the coating may contain at least one functional element.

There is also provided, in accordance with the invention, a method of producing an integrated component. The method comprises the following steps:

providing an integrated component with a main surface and an edge region; and producing at least one contact element for connecting the component to a fastening device, and thereby forming the contact element in the edge region of the integrated component with at least one contact surface inclined relative to a main surface of the integrated component.

In accordance with a concomitant feature of the invention, at least some functional elements of the component are produced in the region of a main surface of a semiconductor substrate. The contact elements are produced in selected regions of the area of the semiconductor substrate, and the functional elements of the component are subsequently separated from the semiconductor substrate such that the contact surfaces are exposed, during the separating step, as side regions of the contact elements.

In other words, the method is carried out in such a way that the component is produced so that the contact element is produced in an edge region of the integrated component in such a way that the contact element has at least one contact surface which is inclined with respect to a main surface of the component.

The method illustrated for producing the component preferably constitutes a partial step in a method of producing a composite comprising a component and a fastening device carrying the component.

Even if it is particularly expedient to produce the contact elements after the active elements, this method can nevertheless be carried out in any desired sequence.

It is particularly expedient to configure this method in such a way that at least some of the functional elements of the component are produced in the region of a main surface of a semiconductor substrate, that the contact elements are produced in selected regions of the area of the semiconductor substrate, and that the functional elements of the component are subsequently separated from the semiconductor substrate in such a way that, during the separation, side regions of the contact elements are exposed.

This embodiment combines a rapid and efficient method of producing one or, as is particularly preferred, a number of integrated electronic circuits in the region of a main surface of a semiconductor substrate with the production of contacts for connecting the integrated circuit or the integrated circuits.

Dicing, i.e., separating the individual integrated circuits, is carried out by means of a suitable separation method. A sawing process is particularly expedient. Carrying out sawing with a saw blade which, during the sawing operation, is aligned in a plane which is orthogonal to the main surface of the semiconductor substrate, leads to defined cut edges. However, guiding the saw blade obliquely, as compared with the orthogonal position, is associated with the advantage that, in the region of the sawn surface, a greater contact area of the contact elements is exposed. Irrespective of the angle at which the sawing operation is carried out, a separation method according to the invention has the advantage that the separating operation, for example the sawing operation, and the exposure of surfaces of the contact elements are carried out with the same process step.

Other features which are considered as characteristic for the invention are set forth in the appended claims.

Although the invention is illustrated and described herein as embodied in an integrated component, composite element comprising an integrated component and a conductor structure, chip card and method of producing the integrated component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a partial vertical section through the semiconductor substrate after the sawing operation;

FIG. 4 is a partial vertical section through the semiconductor substrate after a sawing operation in which the saw blade was set at an angle differing from 90°;

FIG. 5 is a detail of a section through a leadframe 70 with an installed integrated component 45;

FIG. 6 is a partial top perspective view of a leadframe 90 having a different embodiment of the integrated component 35;

FIG. 7 is a plan view of the leadframe illustrated in FIG. 6 with an integrated component 35 installed thereon;.

FIG. 8 is a top perspective view of a conductor structure, on which a component 135 having integrated circuits arranged in a number of planes is fastened, a number of planes of the integrated circuit being connected to the conductor structure;

FIG. 9 is a top perspective view of a different embodiment of a composite element according to the invention comprising an integrated circuit and a fastening device 200 bearing the circuit;

FIG. 10 is a section through a further fastening device 230 according to the invention, which is configured as a housing for an integrated component;

FIG. 11 is a section through a fastening device 290, which likewise has a basic body and two projections 310 and 320;

FIG. 12 is a section through a fastening device 350, which has a basic body 360 and two projections 370 and 380;

FIG. 13 is a section through a suitable possible fastening for an integrated component 400, for example a surface wave filter, having contact elements 410 and 420 located in the edge region of its lower main surface;

FIG. 14 is a section, taking during later processing steps of the composite element illustrated in FIG. 13, and comprising a fastening device 430 and a component 400 disposed in it;

FIG. 15 is a section through a composite element comprising a fastening device 630 and a component 600 designed as a sensor;

FIG. 16 is a perspective view of a composite element comprising a component 700, likewise designed as a sensor, and a carrier plate 740 of a flexible material;

DESCRIPTION OF THE PREFERRED EMBODIMENTS

Figure 1:
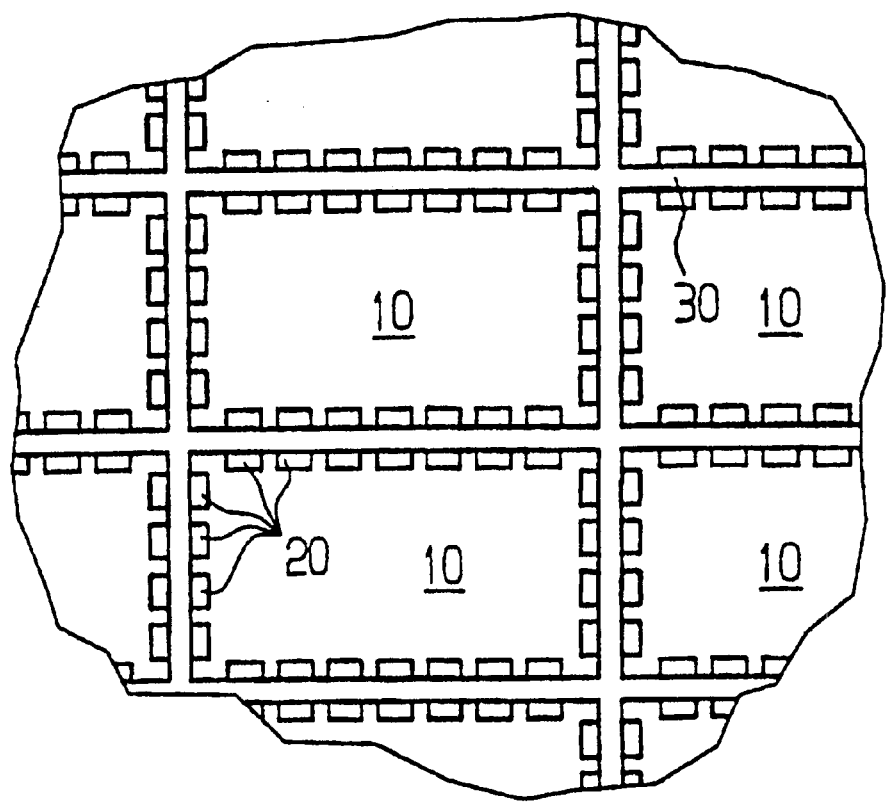
FIG. 1 is a partial plan view of a main surface of a semiconductor substrate containing integrated electric circuits.

Referring now to the figures of the drawing in detail and first, particularly, to the plan view of FIG. 1, there is seen a detail of a semiconductor substrate wafer which contains a large number of integrated electronic circuits 10. The integrated electronic circuits 10 form first examples of integrated components according to the invention or, respectively, a prior stage of further integrated components according to the invention.

The integrated electronic circuits 10 are in each case provided with contact elements 20 in their edge region. Between the integrated circuits 10 there are regions 30 of the semiconductor substrate which are not provided with circuit elements. The regions 30 are arranged in the form of a grid.

A sawing operation, by means of which the individual integrated circuits 10 are separated (generally referred to as dicing), will be explained below with reference to FIGS. 2 and 3.

In the illustration of a cross section through the semiconductor substrate, it can be seen how a saw blade 40 separates two integrated circuits 10, 10' from each other by removing the region 30 (i.e., the kerf) located between them.

The saw blade 40 has a greater width A than that which corresponds to a mutual spacing B between the contact elements 20, 20', so that the contact elements 20, 20' are exposed. However, the width A of the saw blade 40 is chosen to be less than the width of a region x in which there are no functional elements, in order to prevent damage to functional elements located in regions y.

During sawing, microcracks (damage) is produced, which can spread. In order to prevent the spread of the damage in the regions y in which functional elements are located, in addition to the use of the saw blade with a suitable width A, at least the region x is provided between the regions y. The region x can be used, for example, for test structures.

Integrated components 35 which are illustrated in FIG. 3 and in which side regions of the contact elements 20, 20' have been exposed, are produced in the manner illustrated.

This figure makes it clear that the region x not occupied by functional elements has a very much lesser extent than before the separating operation of the integrated electronic circuits.

FIG. 4 illustrates components 45 whose structure essentially corresponds to the components illustrated in FIG. 3. However, differing from the circuits illustrated in FIG. 3, integrated electronic circuits 50, 50' illustrated in FIG. 4 have contact surfaces 62, 62' arranged at an oblique angle in the region of contact elements 60, 60'.

One example of a fastening device with which the components can be connected is a leadframe, such as is illustrated by way of example in FIGS. 5 to 8.

The component illustrated in FIG. 4 is reproduced, by way of example, in a leadframe illustrated in cross section in a detail in FIG. 5.

On an edge region of a leadframe 70 there is a conductive adhesive 80, for example a conductive silver varnish, in particular a conductive silver epoxy varnish, such as is produced by Sumitomo, for example, and marketed under the product designation CRM1033B, by means of which the integrated component 45 is firmly connected to the leadframe, both electrically and mechanically. The leadframe 70 is merely an advantageous exemplary embodiment of a fastening device according to the invention.

In the chosen cross-sectional illustration, it is clearly shown that a contact surface 62 used for the electrical connection of the contact element 60 is enlarged by the beveling in the area of the contact element.

An installation of the integrated component 35 according to the invention illustrated in FIG. 3 into a leadframe 90 is illustrated by way of example in FIG. 6. The leadframe 90 is merely an advantageous exemplary embodiment of a fastening device according to the invention.

The integrated component 35 is connected to an edge region of the leadframe 90 by means of a conductive adhesive, preferably with a conductive silver varnish, in particular a conductive silver epoxy varnish, like the aforementioned conductive silver varnish from the producer Sumitomo.

The leadframe 90 contains conductor strips (leads) 110, 120, which are connected to one contact element 20 of the integrated component 35 in each case by regions of the conductive adhesive 100. An insulating damping material 130 is applied between the regions in which the conductive adhesive 100 is located.

The insulating damping material is composed in such a way that hit not only effects electrical insulation but also prevents the penetration of moisture in the regions covered by it.

A plan view of the conductor structure in FIG. 6 is shown in FIG. 7. It can be seen here that the integrated component 35 is connected to conductor tracks 110, 120 on four side surfaces.

FIG. 8 illustrates a preferred fastening of a component 135. The component 135 contains a stack of layers of a number of integrated circuits arranged one above another. Because of its shape, the component 135 is also referred to as a cubic stacked packet. Within the stack of layers, the individual integrated circuits are connected to one another by a thermally conductive adhesive. The contact elements 170, 180 are located in a surface which is inclined suitably with respect to this contact surface, in a simple case of a cubic structure, the angle being about 90°.

The component 135 is located on a conductor structure 140, which is likewise an advantageous exemplary embodiment of a fastening device that can be used according to the invention.

Arranged on the conductor structure 140 are conductor tracks 150, 160 for the connection of the contact elements 170, 180 located in the integrated circuit. The contact elements 170 arranged in a low structural plane are substantially connected to the conductor tracks 150 in the manner illustrated using FIG. 5 and FIG. 6, respectively. In order to connect the contact elements 180 located in a higher structural plane, use is made of adhesive strips 190 arranged on the conductor tracks 160. The contact elements 170, 180 consist of a material which has both a high conductivity and also a sufficiently low diffusion during the manufacturing process of the integrated component 135, preferably of aluminum. The adhesive strips 190 consist of a conductive adhesive which contains a sufficiently high concentration of an electrically conductive substance.

FIGS. 5, 6, 7 and 8 show examples in which an integrated circuit is connected to a conductor structure by a conductive adhesive (flip-chip technique). However, this illustrated connection is to be viewed merely as an example of a connection between contact elements and a conductor structure. Other connections, for example by means of screen printing of an electrically conductive material, are likewise possible.

The composite elements illustrated in FIGS. 5, 6, 7 and 8 and comprising an integrated circuit and a conductive structure bearing it can be produced in many ways.

In the following text, two preferred manufacturing methods for the composite elements will be explained. Firstly, the integrated electronic circuits are separated, as has been explained, for example, using FIGS. 1, 2, 3 and 4. The integrated component 35, 45 or 135 is then brought into contact with the conductor structure, that is to say in particular the leadframe 70, 90 or a conductor structure 140 designed as a printed circuit board, and fixed at the same time. Particular advantages of such a mounting system can be seen, for example, in a front-end process or in a back-end process.

In a front-end process, a polyimide layer is applied as uniformly as possible. The application of the polyimide layer is carried out by means of a method which ensures the most uniform thickness of the polyimide layer. Since a side contact surface of the contact elements 20, 20', 60, 60', 170 and 180 is exposed, in this case no photochemical process for exposing the contacts (aluminum pads) is necessary.

In a back-end process, the contact elements are connected to the conductor tracks in one step, so that the passage times are reduced by comparison with a front-end process. In addition, the yield of the process is increased.

A further exemplary embodiment of the invention is illustrated below using FIG. 9, which illustrates a perspective view of a further embodiment of a composite element according to the invention, comprising an integrated circuit and a fastening device bearing the circuit. The fastening device is again a carrier plate 200. Between the carrier plate 200 and the integrated component 35 there is a spacer layer 210 which, because of its property of filling up the entire three-dimensional volume underneath the integrated component 35, is referred to as an underfiller. An upper surface of the carrier plate 200 forms a lower boundary for the spacer layer 210. At the sides, the spacer layer 210 is bounded by connecting elements 220.

Figure 2:
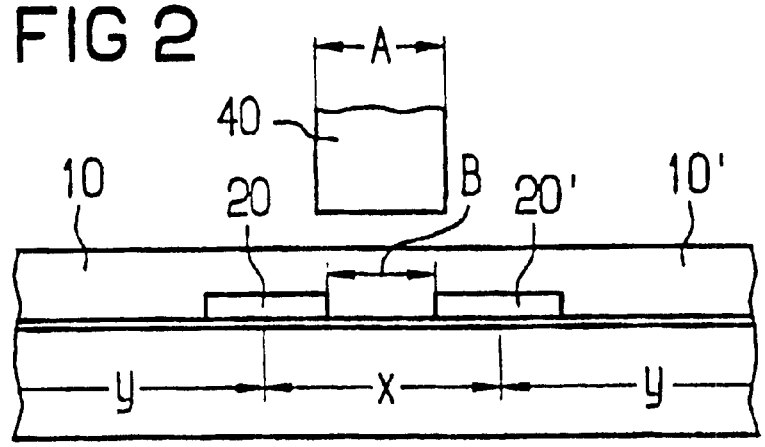
FIG. 2 is a partial vertical sectional view through the semiconductor substrate before a sawing operation.

A composite element of this type can be produced, for example, by the integrated component 35 being produced first, for example using the method described according to FIGS. 1 to 3. The integrated component 35 is then brought into contact with the carrier plate 200 in such a way that the spacer layer 210 is produced between the carrier plate 200 and the integrated component 35. Since, when configuring the integrated component 35, projections, in particular projections on the main surfaces, are avoided, the spacer layer can be cast by casting in a uniform thickness not disrupted by elevations.

The connecting elements 220 are then produced by a suitable method, for example by means of a printing technique, preferably by means of screen printing.

Avoiding projections on the main surfaces of the integrated component 35 has the advantage that corrosion is avoided by completely filling up the space between the integrated component 35 and the carrier plate 200 with the spacer layer 210.

It is therefore expedient, in particular when a spacer layer is used, for there to be no contact elements located in an inner region of the area of the main surface of the integrated component 35.

Such a construction of the integrated circuit or, respectively, a component containing it, has the further advantage that the inner region of the area can be coated.

The arrangement according to the invention of the contact elements can be used in very different components. It is therefore possible, in particular, for the integrated components 35, 45, 135 to be replaced by other components in the exemplary embodiments previously mentioned. In addition, for the fastening device to which the component can be connected, various embodiments which can be combined with a number of different embodiments of the component are expedient.

FIGS. 10, 11 and 12 show embodiments of a fastening device which is configured as a pre-housed leadframe. In this context, "pre-housed" means that the fastening device is configured in such a way that a component can be placed in it while maintaining its dimensions.

FIG. 10 shows a cross section through a fastening device 230 which is configured as a housing for an integrated component.

The fastening device 230 has a basic body 240 and two projections 250, 260 extending vertically in relation to the basic body 240. The projections 250, 260 are configured in such a way that a component can be placed between them. Conductor tracks 270, 280 are configured in such a way that they penetrate the basic body 240 in the region of the projections 250 and 260, respectively.

The fastening device 290 illustrated in FIG. 11 likewise has a basic body and two projections 310 and 320. The projections 310 and 320 are again arranged in such a way that an integrated component can be arranged between them. Conductor tracks 330 and 340, respectively, penetrate the projections 310 and 320, respectively. In the same way as the conductor tracks 270 and 280 illustrated in FIG. 10, the conductor tracks 330 and 340 also have a section which runs essentially parallel to the main surface of the basic body 300 and is intended to make contact with contact elements of a suitably shaped component.

The fastening device 230 and 290 are preferably configured in such a way that a component to be fastened in them is fixed in them by means of a suitable adhesive. However, it is likewise possible to modify these fastening device in such a way that a suitably configured component can be connected to them with a force fit or a form fit. One example of such a form-fitting fastening variant, which permits a plug-in connection, is explained in FIG. 12.

The fastening device 350 illustrated in FIG. 12 has a basic body 360 and two projections 370 and 380.

Between a base 365 of the basic body 360 and the projection 370 there is a conductor track 390, which, in a region intended to make contact with the component, extends on an upper surface of the base 365 and parallel to the latter.

Suitable possible fastenings for an integrated component 400, for example a surface wave filter having contact elements 410 and 420 located in the edge region of its lower main surface, are illustrated in FIGS. 13 and 14.

The fastenings illustrated can of course be used not only in the case of a surface wave filter but in the case of any component which has a substantially comparable topological structure.

The component 400 is located on a fastening device 430, which is configured substantially like the fastening device 230 illustrated in FIG. 10. It likewise has a basic body 440, projections 450 and 460 and conductor tracks 470 and 480. As opposed to the exemplary embodiment illustrated in FIG. 10, the conductor tracks 470 and 480 in this case end flush with side edges of bases 44 d 448 of the basic body 440.

Otherwise, the regions of the conductor tracks 470 and 480 which face the component 400 are substantially parallel to the upper surfaces of the bases 445 and 448.

The conductor tracks 470 and 480 are in direct mechanical and electrical contact with the contact elements 410 and 420, respectively. In order to fix the component 400 within the fastening device 430, and to improve the electrical contact between the conductor tracks 470 and 480 and the contact elements 410 and 420, respectively, the contact elements 410, 420 are additionally connected to the conductor tracks 470, 480 via contact adhesive 490, 500.

In the illustration of FIG. 13, it can be seen that between the lower main surface of the component 400 and the surface of the basic body 440 which faces it there is a gap 405, which is preferably filled with air. The gap 405 has a defined thickness d which remains constant over its entire longitudinal extent.

The exact position of the component 400 within the fastening device 430 is effected by suitable spacers 510 which are present in a different sectional plane and illustrated below in FIG. 14. Spacers of this type are produced, for example, by means of an injection-molding method and arranged between adjacent conductor strips.

FIG. 14 shows later processing steps of the composite, illustrated in FIG. 13, comprising the fastening device 430 and the component 400 arranged in it. In this case, the left-hand side of FIG. 14 shows a spacer 510 which is used to clamp the component 400 firmly on the projection 415. The spacer 510 is preferably applied by casting after the introduction of the component 400 into the fastening device 430. A fastening of this type is described as partially encapsulated.

A completely encapsulated variant is illustrated in the right-hand part of FIG. 14. In this illustration, there is a casting compound 520 both between the projection 460 and that side surface of the component 400 that faces it, and on an upper surface of the component 400.

The fastening device illustrated using FIGS. 10 to 14 are distinguished by the fact that they form a pre-housed leadframe.

The use of pre-housed leadframes is associated with the advantage that one or more component can be mounted in them in a manner which is particularly low in mechanical stresses. The ready-made composite elements of component and fastening device are distinguished by the fact that they contain only a few different chemical substances, so that any mutual chemical influence is reduced. In addition, the materials used have an increased chemical resistance.

The selected exemplary embodiments of the mounting of the component may be used expediently in particular where a defined distance d' between the component and a region of the fastening device is expedient.

Possible fastenings for an integrated component 400, for example a surface wave filter having contact elements 410 and 420 located in the edge region of its lower main surface, are illustrated in FIGS. 13 and 14.

The fastenings illustrated can of course be used not only in a surface wave filter but in any component which has a substantially comparable topological structure.

FIG. 15 shows a composite element comprising a component 600 formed by a sensor and a fastening device 630 bearing the component. The fastening device 630 is configured substantially in the same way as the fastening device 230 illustrated in FIG. 10. It likewise has a basic body 640, projections 650 and 660 and conductor tracks 670 and 680. As opposed to the exemplary embodiment illustrated in FIG. 10, in this case the conductor tracks 670 and 680 end flush with side edges of bases 645 and 648 of the basic body 640. Otherwise, the regions of the conductor tracks 670 and 680 that face the component 600 are substantially parallel to upper surfaces of the bases 645 and 648.

The conductor tracks 670 and 680, respectively, are in direct mechanical and electrical contact with the contact elements 610 and 620, respectively. In order to fix the component 600 within the fastening device 630, and to improve the electrical contact between the conductor tracks 670 and 680 and the contact elements 610 and 620, respectively, the contact elements 610, 620 are additionally connected to the conductor tracks 670, 680 via conductive adhesive 690, 695.

The preferred, low-stress mounting in a pre-housed leadframe is also advantageous when mounting the component 600.

In the case of a composite element comprising fastening device 630 and component 600 designed as a sensor, it is particularly advantageous that the thickness d' of the gap 605 between a lower main surface of the component 600 and an upper surface of the basic body 640 can be selected variably over wide ranges, preferably in the range of 50 $\mu$m to 100 $\mu$m.

The component 600 is preferably any desired sensor, for example for a mechanical, chemical or biological variable. Because of the low-stress mounting, it is particularly expedient to configure the component 600 in such a way that it is extended, with suitable micromechanical components, to form a microsystem and therefore, for example, can be used as a movement or pressure sensor. Instead of the component 600 configured as a sensor, a suitable microsystem can also be provided.

Instead of arranging the sensor at a fixed distance d' from a surface of a basic body, other arrangements of a component 700 designed as a sensor are likewise expedient.

A particularly advantageous composite element having a component 700 configured as a sensor will be explained below using FIG. 16.

FIG. 16 shows a plan view of a composite element comprising a component 700 and a carrier plate 740 of a flexible material.

In an edge region, the component 700 has contact elements 720 which run flush both with a main surface and with a side surface of the component 700. The contact elements 720 are in direct mechanical and electrical contact with conductor tracks 750. In addition, sections of a conductive adhesive 780 are arranged in such a way that they effect a further connection between the contact elements 720 and the conductor tracks 750.

A further example, in which a component 800 is formed by an integrated electronic circuit, is illustrated and described below with reference to FIG. 17.

Figure 17:
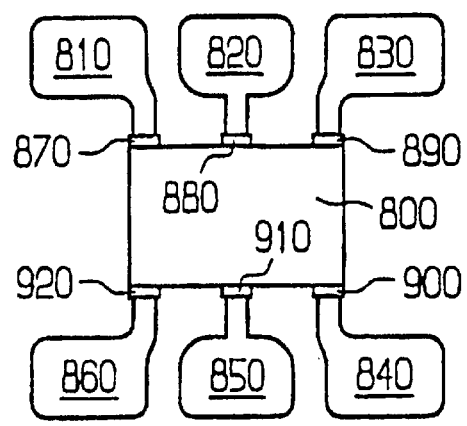
FIG. 17 is a plan view of a region of a chip card or smart card, the region containing a component 800 in the form of an intergrated electronic circuit and connecting regions 810, 820, 830, 840, 850 and 860 for making contact between the integrated circuit 800 and a card reading or writing unit.

FIG. 17 shows a region of a chip card in which there is the integrated component 800 and connecting regions 810, 820, 830, 840, 850 and 860 for making contact between the integrated component 800 and a card reading or writing unit.

Between the connecting regions 810, 820, 830, 840, 850 and 860 and contact elements 805 illustrated below in FIG. 18 and arranged in an edge region of the integrated component 800, there are contact regions 870, 880, 890, 900, 910 and 920.

Figure 18:
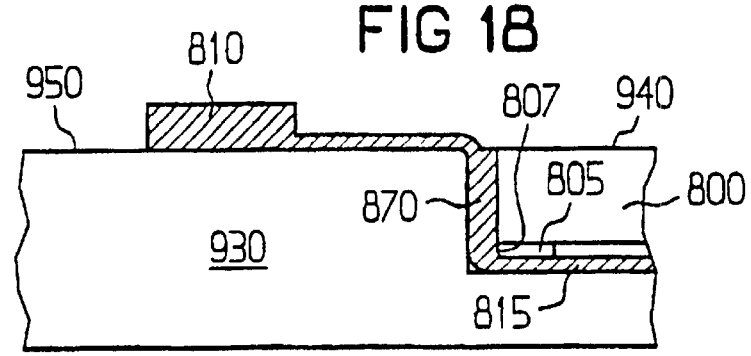
FIG. 18 is a partial sectional view, illustrated as a detail, of the chip card in the area of the contact region 870.

The installation of the integrated component 800 in a basic body 930 of the chip card is clarified from the cross section of the chip card, illustrated in detail in FIG. 18, in the area of the contact region 870.

It can be seen here that a contact surface 807 of a contact element 805 of the integrated component 800 is located within a recess in the chip card and is in direct mechanical and electrical contact with the contact region 870.

In such an arrangement, the rear of the component 800, that is to say in particular the integrated electronic circuit forming the component, faces the outside. The rear 940 is preferably located at the same level as a surface 950 of the chip card.

The above-described chip card may be produced in a particularly expedient way as follows: firstly, the card is produced, including connecting regions 810 to 860 and contact regions 870 to 920, and is then tested. After this test has proceeded successfully, the integrated electronic is then fitted. This method has the advantage that the integrated component 800 is only fitted to card carriers which have been prepared without faults. Since the production of the integrated component 800 is very much more complicated than the production of the card carrier, and since a certain reject rate cannot be avoided technically during the production of the connecting regions 810 to 860 and the contact regions 870 to 920, respectively, this variant of the method is particularly expedient.

The chip card (or smart card) illustrated is distinguished by the fact that the contact elements are protected particularly well against external influences, in particular against mechanical loading or chemical reaction processes, and by the fact that the underside of the integrated component 800 terminates flush with a conductor track 815.

In addition, it is possible for the outwardly facing rear of the component 800, that is to say in particular the corresponding integrated electronic circuit, to be configured appropriately for a desired use. Such a configuration can consist, for example, in printing, in labeling, for example by means of a laser, or in being provided with a suitable material, for example a protective varnish. The use of such a protective varnish which can be printed over if appropriate, has the further advantage that the component, that is to say in particular the corresponding integrated electronic circuit, the conductor track 850 and the contact region 870 can be protected still further.

It is particularly advantageous, during the production of the chip card, to employ a lamination technique by means of which a suitable layer is applied. The layer may have numerous functions.

Figure 19:
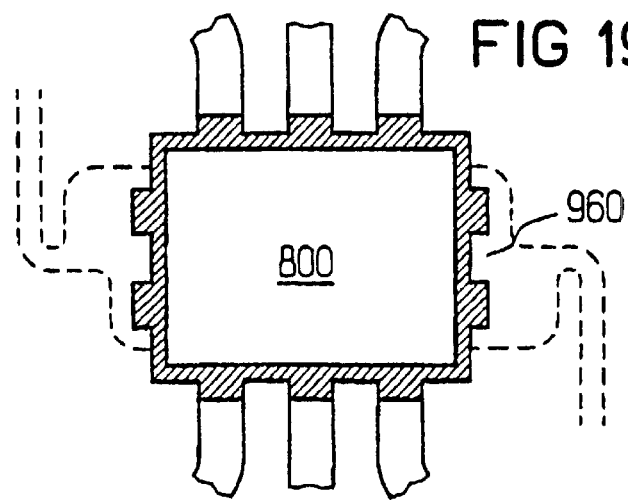
FIG. 19 is a partially diagrammatic plan view of a region of the chip card in which a functional element, for example an inductive coil 960, is fitted to the surface of the integrated component 800.

A particularly advantageous exemplary embodiment of a chip card, in which the ability to configure the surface 940 of the integrated component 800 freely is utilized, results from the plan view, illustrated below using FIG. 19, of a region of the chip card in which a functional element, for example an inductive coil 960, is fitted to the surface of the integrated component 800. The coil 960 is preferably produced by means of a lamination technique.

The exemplary embodiments illustrated are to be understood as being purely exemplary. In particular, the various embodiments of components according to the invention can be replaced by other components. In addition, it is possible for the conductor structures illustrated to be replaced by other conductor structures containing comparable dimensions and/or connections.

The illustrated advantages of the various embodiments may be combined with one another, therefore, for example, coating of inner regions of the area of the main surface can expediently be employed in all the components illustrated.

We claim:

1. An integrated component, comprising:
   a component body having a main surface with functional elements of the integrated component and with an edge region without functional elements;
   a plurality of contact elements disposed at said edge region of said main surface, said contact elements projecting into said edge region of said main surface and having at least one contact surface inclined with respect to said main surface;
   said component body being configured to be fastened to conductor tracks of a fastening device, wherein the conductor tracks are disposed to face said component body and extend parallel to said main surface of said component body.

2. The component according to claim 1, wherein said contact elements are arranged in said edge region of said component body such that at least a portion thereof is in contact with said edge region of said main surface of said component body, and wherein, when said component body is installed, said contact elements are brought into contact with at least two surfaces of said fastening device arranged at an angle different from 0°.

3. The component according to claim 1, wherein said main surface has an inner area without contact elements.

4. The component according to claim 3, wherein said inner area is at least one of printed and coated.

5. A composite element, comprising a conductor structure and an integrated component according to claim 1 disposed on said conductor structure.

* * * * *